(12) United States Patent
Pu et al.

(10) Patent No.: US 11,216,938 B2
(45) Date of Patent: Jan. 4, 2022

(54) SYSTEMS AND METHODS OF OPTIMAL METROLOGY GUIDANCE

(71) Applicant: ASML Netherlands B.V., Veldhoven (NL)

(72) Inventors: Lingling Pu, San Jose, CA (US); Wei Fang, Milpitas, CA (US); Nan Zhao, San Jose, CA (US); Wentian Zhou, San Jose, CA (US); Teng Wang, San Jose, CA (US); Ming Xu, San Jose, CA (US)

(73) Assignee: ASML Netherlands B.V., Veldhoven (NL)

( * ) Notice: Subject to any disclaimer, the term of this patent is extended or adjusted under 35 U.S.C. 154(b) by 60 days.

(21) Appl. No.: 16/554,110

(22) Filed: Aug. 28, 2019

(65) Prior Publication Data

US 2020/0074610 A1 Mar. 5, 2020

Related U.S. Application Data

(60) Provisional application No. 62/723,983, filed on Aug. 28, 2018.

(51) Int. Cl.
*G06T 7/00* (2017.01)
*G06T 7/60* (2017.01)
*H01L 21/66* (2006.01)

(52) U.S. Cl.
CPC .............. *G06T 7/001* (2013.01); *G06T 7/60* (2013.01); *G06T 2207/10061* (2013.01);
(Continued)

(58) Field of Classification Search
CPC . G06T 2207/10061; G06T 2207/30148; G06T 2207/30168; G06T 5/002;
(Continued)

(56) References Cited

U.S. PATENT DOCUMENTS 7,479,633 B2 1/2009 Archie
8,461,527 B2 6/2013 Nakahira et al.
(Continued)

FOREIGN PATENT DOCUMENTS

TW 201430338 A 8/2014
TW 201830340 A 8/2018

OTHER PUBLICATIONS

International Search Report issued in related International Application No. PCT/EP2019/072105, dated Dec. 4, 2019 (3 pgs.).
(Continued)

*Primary Examiner* — Ian L Lemieux
(74) *Attorney, Agent, or Firm* — Finnegan, Henderson, Farabow, Garrett & Dunner, LLP

(57) ABSTRACT

Systems and methods for optimal electron beam metrology guidance are disclosed. According to certain embodiments, the method may include receiving an acquired image of a sample, determining a set of image parameters based on an analysis of the acquired image, determining a set of model parameters based on the set of image parameters, generating a set of simulated images based on the set of model parameters. The method may further comprise performing measurement of critical dimensions on the set of simulated images and comparing critical dimension measurements with the set of model parameters to provide a set of guidance parameters based on comparison of information from the set of simulated images and the set of model parameters. The method may further comprise receiving auxiliary information associated with target parameters including critical dimension uniformity.

15 Claims, 7 Drawing Sheets

(52) U.S. Cl.
CPC .............. *G06T 2207/30148* (2013.01); *G06T 2207/30168* (2013.01); *H01L 22/12* (2013.01)

(58) Field of Classification Search
CPC ......... G06T 7/0002; G06T 7/001; G06T 7/60; H01L 22/12; G03F 1/86; G03F 7/70625; G03F 7/7065
See application file for complete search history.

(56) References Cited

U.S. PATENT DOCUMENTS

| | | | |
|---|---|---|---|
| 9,518,932 B2 | 12/2016 | Park | |
| 9,823,586 B2 | 11/2017 | Quintanilha | |
| 10,488,188 B2* | 11/2019 | Mack | G03F 7/705 |
| 10,510,509 B2* | 12/2019 | Mack | H01J 37/222 |
| 10,522,322 B2* | 12/2019 | Mack | G06T 7/13 |
| 10,648,801 B2* | 5/2020 | Mack | G06T 5/10 |
| 10,656,532 B2* | 5/2020 | Mack | H01J 37/222 |
| 10,664,955 B2* | 5/2020 | Mack | G06T 5/002 |
| 2005/0120327 A1* | 6/2005 | Ye | G06T 7/0004 716/52 |
| 2005/0173633 A1 | 8/2005 | Tanaka et al. | |
| 2007/0135959 A1 | 6/2007 | Vuong et al. | |
| 2008/0197280 A1* | 8/2008 | Tanaka | G01N 23/225 250/306 |
| 2011/0255770 A1* | 10/2011 | Touya | G01N 21/9503 382/144 |
| 2012/0121160 A1* | 5/2012 | Matsuoka | G06T 7/001 382/145 |
| 2012/0123748 A1* | 5/2012 | Aben | G03F 7/705 703/2 |
| 2012/0151428 A1* | 6/2012 | Tanaka | G01B 15/04 716/112 |
| 2013/0336574 A1* | 12/2013 | Nasser-Ghodsi | G06T 7/001 382/145 |
| 2014/0086475 A1* | 3/2014 | Daneshpanah | G06T 7/001 382/144 |
| 2016/0012579 A1* | 1/2016 | Shi | G01N 21/956 382/149 |
| 2016/0116420 A1 | 4/2016 | Duffy et al. | |
| 2016/0313653 A1* | 10/2016 | Mink | G01B 11/272 |
| 2017/0160648 A1* | 6/2017 | Tel | G03F 7/705 |
| 2017/0193400 A1 | 7/2017 | Bhaskar et al. | |
| 2017/0309008 A1* | 10/2017 | Shi | G03F 1/84 |
| 2017/0345140 A1 | 11/2017 | Zhang et al. | |
| 2018/0165404 A1* | 6/2018 | Eyring | G01B 21/00 |
| 2018/0173839 A1* | 6/2018 | Fang | G03F 7/705 |
| 2018/0218492 A1* | 8/2018 | Zhang | G06K 9/4604 |
| 2018/0275521 A1* | 9/2018 | Wallow | G03F 7/70508 |
| 2018/0364587 A1* | 12/2018 | Baselmans | G03F 7/7085 |
| 2019/0067060 A1* | 2/2019 | Plihal | G06T 7/001 |
| 2019/0318949 A1* | 10/2019 | Banerjee | H01L 21/67271 |
| 2019/0391500 A1* | 12/2019 | Kiers | G03F 7/705 |
| 2020/0074610 A1* | 3/2020 | Pu | G03F 7/7065 |
| 2020/0159124 A1* | 5/2020 | Wang | G03F 7/70433 |
| 2020/0265574 A1* | 8/2020 | Brauer | G06T 7/001 |
| 2021/0097665 A1* | 4/2021 | Chuang | G03F 7/70625 |

OTHER PUBLICATIONS

Zou, Y.B., et al.; "Use of the model-based library in critical dimension measurement by CD-SEM"; Measurement, Institute of Measurement and Control; vol. 123; Mar. 23, 2018; pp. 150-162 (14 pgs.).

Office Action of the Intellectual Property Office of Taiwan issued in related Taiwanese Patent Application No. 108130569; dated Dec. 28, 2020 (12 pgs.).

* cited by examiner

SYSTEMS AND METHODS OF OPTIMAL METROLOGY GUIDANCE

CROSS-REFERENCE TO RELATED APPLICATIONS

This application claims priority of U.S. application 62/723,983 which was filed on Aug. 28, 2018, and which is incorporated herein in its entirety by reference.

FIELD

The description herein relates to the field of metrology guidance, and more particularly to an optimal metrology guidance system recommending parameters for metrology.

BACKGROUND

In manufacturing processes of integrated circuits (ICs), unfinished or finished circuit components are inspected to ensure that they are manufactured according to design and are free of defects. Inspection systems utilizing optical microscopes or charged particle (e.g., electron) beam microscopes, such as a scanning electron microscope (SEM) can be employed. As the physical sizes of IC components continue to shrink, accuracy and yield in defect detection become more and more important. Also important is the critical dimension control for monitoring semiconductor manufacturing processes and reproducibility of features on a wafer. Metrology parameters are set-up empirically due to lack of ground truth knowledge of inspection tool conditions and statistics of underlying imaging samples.

Thus, related art systems face limitations in, for example, accuracy of critical dimension measurements through metrology for semiconductor manufacturing processes. Further improvements in the art are desired.

SUMMARY

Embodiments of the present disclosure provide systems and methods for a metrology system. In some embodiments, a metrology system is provided. The metrology system may comprise a memory storing a set of instructions, and a processor. The processor of the metrology system may be configured to execute the set of instructions to cause the metrology system to receive an acquired image, determine a set of image parameters based on an analysis of the acquired image, determine a set of model parameters from the set of image parameters, generate a set of simulated images using the set of model parameters, and output a set of guidance parameters based on an analysis of the set of simulated images and the set of model parameters. The metrology system may comprise a charged particle beam apparatus configured to acquire the image of the sample. The set of simulated images may include a single simulated image. The analysis may comprise a comparison of information from the set of simulated images and the set of model parameters. The information from the set of simulated images may comprise critical dimension measurement results. The set of image parameters may include noise levels, pattern of interest, line roughness, or edge profile, and the set of model parameters are determined from the set of image parameters based on a quality metric or a plurality of quality metrics. The plurality of quality metrics may include any or local noise level, global noise level, edge profile statistics, or pattern structure. The set of guidance parameters may include one or more of recommended imaging parameter, critical dimension uniformity parameter, measurement precision, repeatability, or measurement accuracy. The processor of the metrology system may be further configured to execute the set of instructions to further cause the metrology system to receive auxiliary information associated with target parameters, and analyze the acquired image based on the received auxiliary information. The target parameters may include targeted pitch, targeted critical dimension uniformity, targeted pattern, or targeted measurement precision. The set of instructions may cause the metrology system to further perform measurement of critical dimensions on the simulated image and compare critical dimension measurements with the set of model parameters.

In some embodiments, a metrology guidance system is provided. The metrology guidance system may include a memory storing a set of instructions, and a processor configured to execute the set of instructions to cause the metrology guidance system to determine a set of image parameters based on an analysis of the acquired image, determine a set of model parameters based on the set of image parameters, generate a set of simulated images based on the set of model parameters, analyze the set of simulated images, and output a set of guidance parameters based on an analysis of the set of simulated images and the set of model parameters. The set of simulated images may include a single simulated image. The analysis may comprise a comparison of information from the set of simulated images and the set of model parameters. The information from the set of simulated images may comprise critical dimension measurement results. The analysis of the sot of simulated images may include performing measurement of critical dimensions on the set of simulated images, and comparing critical dimension measurements with the set of model parameters. The set of instructions may cause the metrology system to further receive auxiliary information associated with target parameters and analyze acquired image based on the received auxiliary information. The target parameters may include targeted pitch, targeted critical dimension uniformity, targeted pattern, or targeted measurement precision. The set of image parameters may include noise levels, pattern of interest, line roughness, or edge profile, and the set of model parameters are determined from the set of image parameters based on a quality metric or a plurality of quality metrics. The plurality of quality metrics may include local noise level, global noise level, edge profile statistics, or pattern structure. The set of guidance parameters may include one or more or recommended imaging parameter, critical dimension uniformity parameter, measurement precision, repeatability, or measurement accuracy.

In some embodiments, a metrology guidance method is provided. The method may include receiving an acquired image of a sample, determining a set of image parameters based on an analysis of the acquired image, determining a set of model parameters based on the set of image parameters, generating a set of simulated images based on the set of model parameters, and providing a set of guidance parameters based on an analysis of the set of simulated images and the set of model parameters. The method may further comprise performing measurement of critical dimensions on the set of simulated images and comparing critical dimension measurements with the set of model parameters. The set of simulated images may include a single simulated image. The analysis may comprise a comparison of information from the set of simulated images and the set of model parameters. The information from the set of simulated images may comprise critical dimension measurement results. The method may further comprise receiving auxiliary information associated with target parameters and analyze acquired image based on the received auxiliary information. The target parameters may include targeted pitch, targeted critical dimension uniformity, targeted pattern, or targeted measurement precision.

In some embodiments, a non-transitory computer readable medium comprising a set of instructions that are executable by one or more processors of an apparatus is claimed. The apparatus may perform receiving an acquired image of a sample, determining a set of image parameters based on an analysis of the acquired image, determining a set of model parameters based on the set of image parameters, generating a set of simulated images based on the set of model parameters, and providing a set of guidance parameters based on an analysis of the set of simulated images and the set of model parameters. The set of instructions may cause the apparatus to perform measurement of critical dimensions the set of simulated images, and compare critical dimension measurements with the set of model parameters. Further, the set of instructions may also cause the apparatus to receive auxiliary information associated with target parameters and analyze the acquired image based on the received auxiliary information.

DETAILED DESCRIPTION

Figure 1:
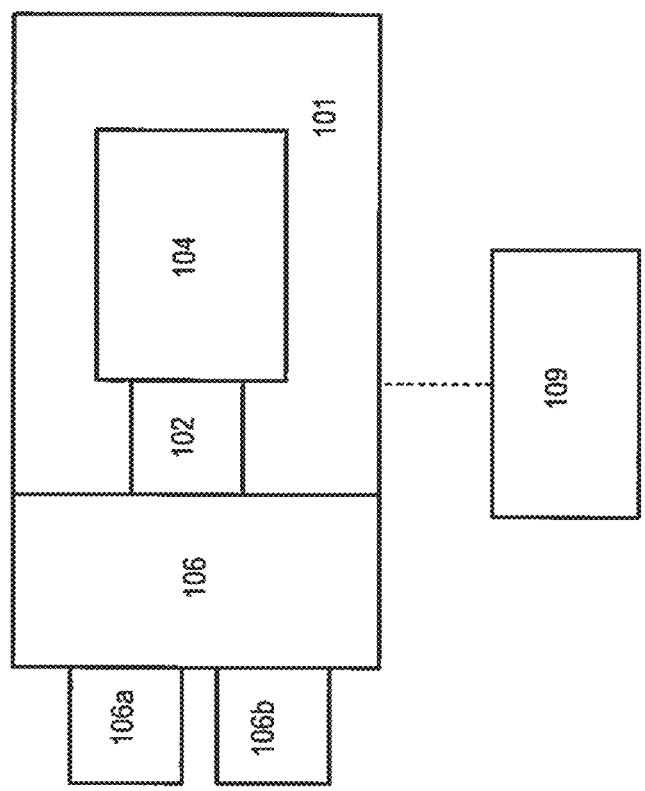
FIG. 1 is a schematic diagram illustrating an exemplary electron beam inspection (EBI) system, consistent with embodiments of the present disclosure.

Reference will now be made in detail to exemplary embodiments, examples of which are illustrated in the accompanying drawings. The following description refers to the accompanying drawings in which the same numbers in different drawings represent the same or similar elements unless otherwise represented. The implementations set forth in the following description of exemplary embodiments do not represent ail implementations consistent with the disclosure. Instead, they are merely examples or apparatuses and methods consistent with aspects related to the subject matter recited in the appended claims. For example, although some embodiments are described in the context of utilizing electron beams, the disclosure is not so limited. Other types of charged particle beams may be similarly applied. Furthermore, other imaging systems may be used, such as optical imaging, photo detection, x-ray detection, etc.

The enhanced computing power of electronic devices, while reducing the physical size of the devices, can be accomplished by significantly increasing the packing density of circuit components such as, transistors, capacitors, diodes, etc. on an IC chip. For example, in a smart phone, an IC chip (which is the size of a thumbnail) may include over 2 billion transistors, the size of each transistor being less than $\frac{1}{1000}^{th}$ of a human hair. Not surprisingly, semiconductor IC manufacturing is a complex process, with hundreds of individual steps. Errors in even one step have the potential to dramatically affect the functioning of the final product, Even one "killer defect" can cause device failure. The goal of the manufacturing process is to improve the overall yield of the process. For example, for a 50-step process to get 75% yield, each individual step must have a yield greater than 99.4%, and if the individual step yield is 95%, the overall process yield drops to 7%.

While high process yield is desirable in an IC chip manufacturing facility, it is also essential to maintain a high wafer throughput, defined as the number of wafers processed per hour. High process yields, and high wafer throughput can be impacted by the presence of defects, especially when operator intervention is involved. Thus, detection and identification of micro and nano-sized defects by inspection tools (such as, a SEM is essential for maintaining high yields and low cost. A defect may refer to an abnormal condition of a component on a sample or a wafer that may lead to a failure. In some embodiments, a defect may refer to an aberration in comparison to a standard. Defects may include, for example, particle contamination, surface defects, etc. In addition to detecting and identifying defects, a SEM inspection tool can also be used to identify the source of a defect by providing high-resolution images in combination with elemental analysis of the microscopic structures on the wafer.

However, for identifying defects through high-resolution SEM imaging, it should be appreciated that there are a number of parameters to consider while imaging and measuring critical dimensions, for example, imaging parameters, noise levels, field-of-view, pixel size, number of images, window size, number of averaging pixels, etc. As an example, determining whether a surface defect in the channel area of a field-effect transistor on the wafer is caused by the presence of an undesired particle or the absence of a desired material can be challenging if the imaging parameters of the SEM inspection tool are not optimized. The presence of an undesired particle, such as dust, may indicate air filter issues in the facility or external sources introducing dust particles in the process, whereas the absence of a desired material may indicate a process or a material related issue. The correct determination of the surface defect may require a specific electron beam energy, acceleration voltage, beam aperture, spot size, depth-of-view, etc.

In practice, some of the aforementioned parameters are determined empirically by humans, rendering the inspection process susceptible to errors, due to lack of ground-truth knowledge of, for example, information related to tool physical conditions, tool maintenance records, statistics of underlying imaging samples, etc. Relying on human operator judgement for inspection through SEM imaging may result in defect misidentification and misleading wafer signature analysis, impacting the cost, efficiency and throughput of the process. The proposed optimal metrology guidance system in this disclosure may significantly improve defect identification by determining the optimized parameters for inspection, imaging, or measuring using SEM.

Wafer signature, as used herein, may refer to spatial patterns of systematic defects, indicative of process defects that need to be identified and tracked. During the manufacturing process, semiconductor wafers go through numerous chemical and mechanical processing steps. A finished wafer is cut up into chips before they are packaged. Each processing step may be susceptible to process variations as well as tool recipe issues that may render affected chips useless. In many cases, these process defects are systematic in nature and result in a systematic wafer signature of failing dies. In some cases, multiple signatures may exist on one wafer and it may be critical to identify which signature most affects the wafer throughput so the resources can be focused on addressing the biggest yield detractors.

Figure 4:
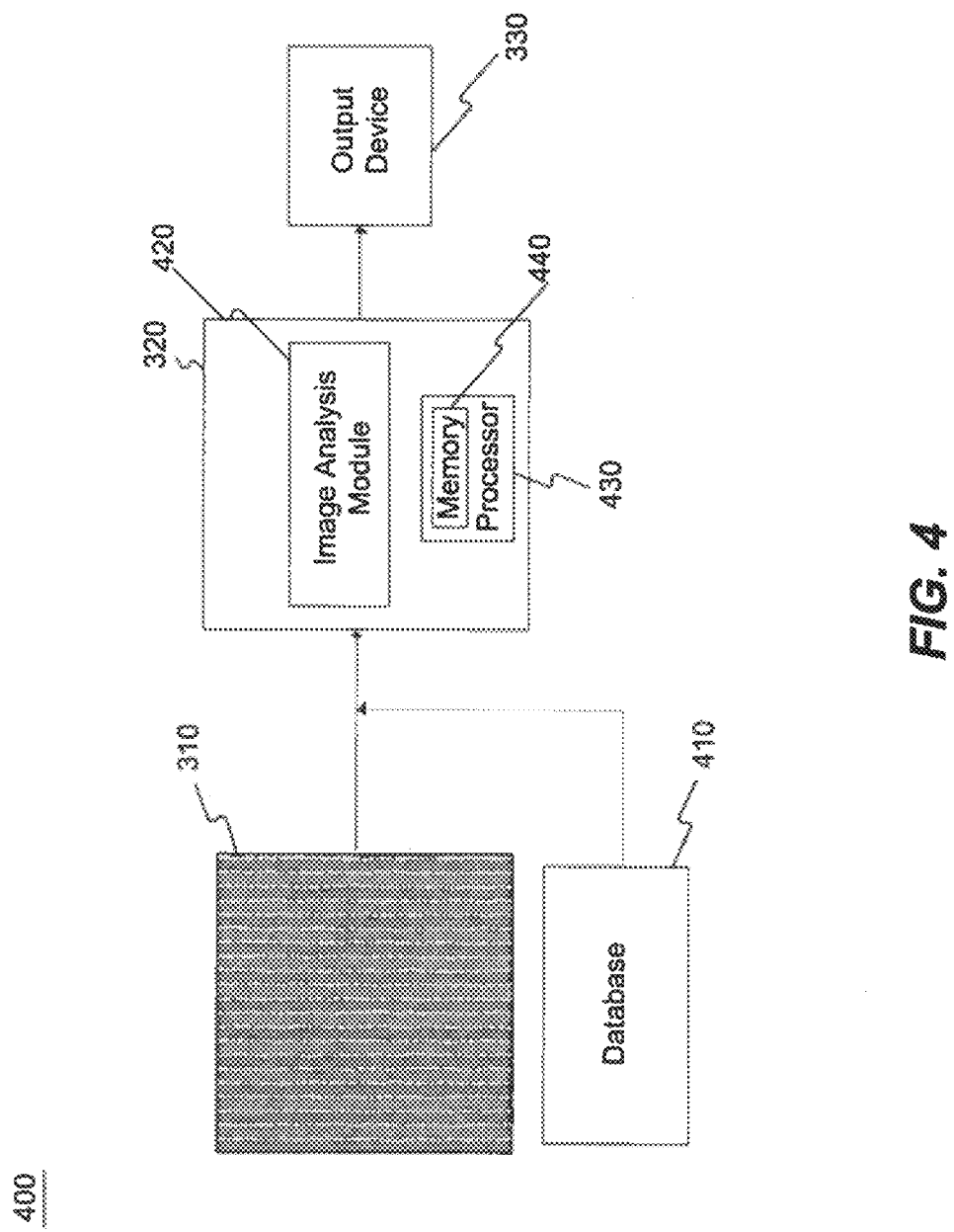
FIG. 4 is a block diagram illustrating an exemplary metrology system, consistent with embodiments of the present disclosure.

In one aspect of the present disclosure, a SEM inspection tool may be used to acquire an initial image of a pattern or a region of a wafer (such as image 310 of FIG. 4). Using the acquired image and target information associated with the image, a metrology guidance system (such as a metrology guidance system 320 of FIG. 5) can infer one or more initial image parameters, for example, noise levels, pattern of interest, pattern pitch, pattern yield, gap yield, line roughness, etc. The metrology guidance system can determine a set of estimated model parameters from the one or more image parameters, and generate simulated images (such as simulated images 625 of FIG. 6) based on the estimated model parameters. The metrology guidance system can provide a set of guidance parameters and recommendations based on the comparison of critical dimension measurements on the simulated images and the set of estimated model parameters.

Relative dimensions of components in drawings may be exaggerated for clarity. Within the following description of drawings, the same or like reference numbers refer to the same or like components or entities, and only the differences with respect to the individual embodiments are described.

As used herein, unless specifically stated otherwise, the term "or" encompasses all possible combinations, except where infeasible. For example, if it is stated that a database may include A or B, then, unless specifically stated otherwise or infeasible, the database may include A, or B, or A and B. As a second example, if it is stated that a database may include A, B, or C, then, unless specifically stated otherwise or infeasible, the database may include A, or B, or C, or A and B, or A and C, or B and C, or A and B and C.

Reference is now made to FIG. 1, which illustrates an exemplary electron beam inspection (EBI) system 100 consistent with embodiments of the present disclosure. EBI system 100 may be used for imaging. As shown in FIG. 1, EBI system 100 includes a main chamber 101 a load/lock chamber 102, an electron beam tool 104, and an equipment from end module (EFEM) 106. Electron beam tool 104 is located within main chamber 101. EFEM 106 includes a first loading port 106a and a second loading port 106b. EFEM 106 may include additional loading port(s). First loading port 106a and second loading port 106b receive wafer front opening unified pods (FOUPs) that contain wafers (e.g., semiconductor wafers or wafers made of other material(s)) or samples to be inspected (wafers and samples may be used interchangeably). A lot containing a plurality of wafers may be loaded for processing as a batch.

One or more robotic arms (not shown) in EFEM 106 may transport the wafers to load/lock chamber 102. Load/lock chamber 102 is connected to a load/lock vacuum pump system (not shown) which removes gas molecules in load/lock chamber 102 to reach a first pressure below the atmospheric pressure. After reaching the first pressure, one or more robotic arms (not shown) may transport the wafer from load/lock chamber 102 to main chamber 101. Main chamber 101 is connected to a main chamber vacuum pump system (not shown) which removes gas molecules in main chamber 101 to reach a second pressure below the first pressure. After reaching the second pressure, the wafer is subject to inspection by electron beam tool 104. Electron beam tool 104 may be a single-beam system or a multi-beam system.

A controller 109 is electronically connected to electron beam tool 104. Controller 109 may be a computer configured to execute various controls of EBI system 100. While controller 109 is shown in FIG. 1 as being outside of the structure that includes main chamber 101, load/lock chamber 102, and EFEM 106, it is appreciated that controller 109 may be a part of the structure.

Figure 2:
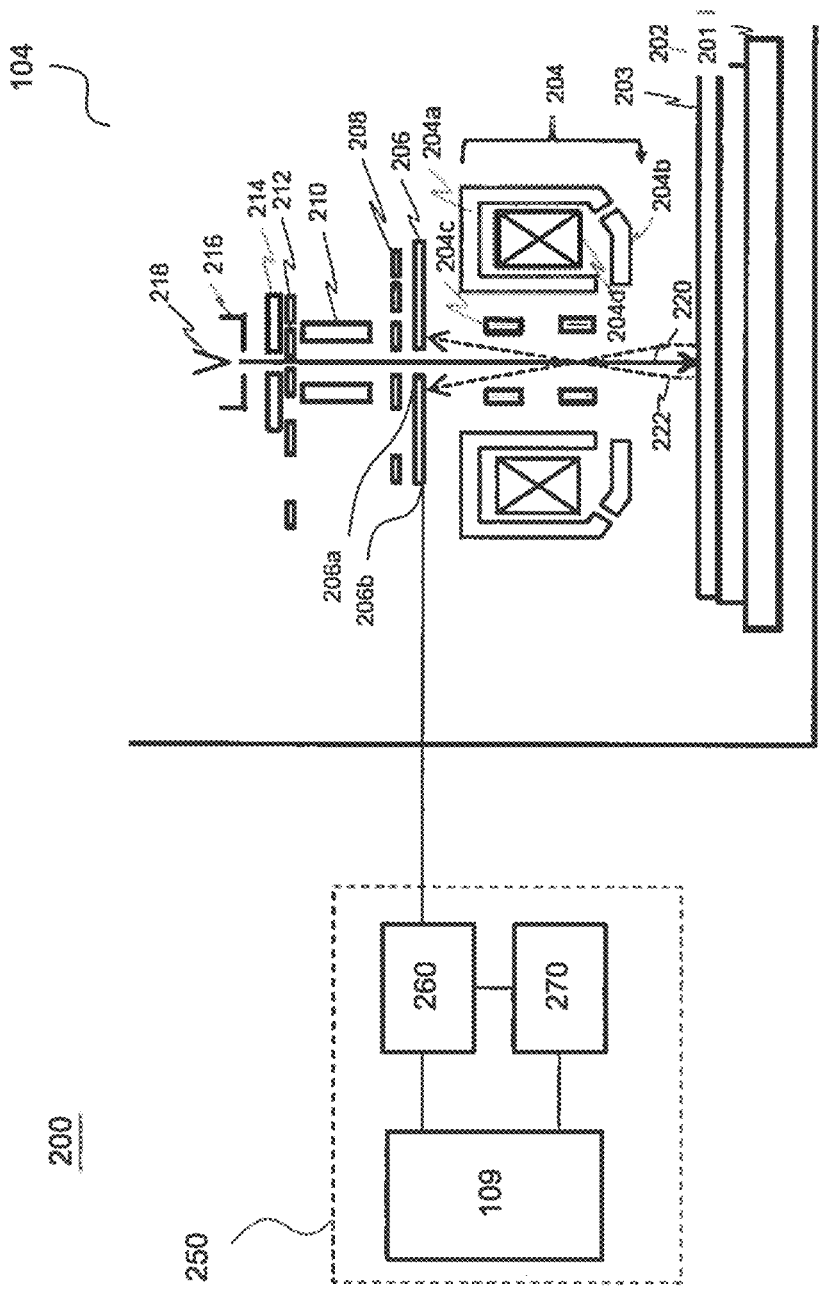
FIG. 2 is a schematic diagram illustrating an exemplary imaging system, consistent with embodiments of the present disclosure.

FIG. 2 illustrates an exemplary imaging system 200 according to embodiments of the present disclosure. Electron beam tool 104 of FIG. 2 may be configured for use in EBI system 100. Electron beam tool 104 may be a single beam apparatus or a multi-beam apparatus. As shown in FIG. 2, electron beam tool 104 includes a motorized sample stage 201, and a wafer holder 202 supported by motorized sample stage 201 to hold a wafer 203 to be inspected. Electron beam tool 104 further includes an objective lens assembly 204, an electron detector 206 (which includes electron sensor surfaces 206a and 206b), an objective aperture 208, a condenser lens 210, a beam limit aperture 212, a gun aperture 214, an anode 216, and a cathode 218. Objective lens assembly 204, in some embodiments, may include a modified swing objective retarding immersion lens (SORIL), which includes a pole piece 204a, a control electrode 204b, a deflector 204c, and an exciting coil 204d. Electron beam tool 104 may additionally include an energy dispersive X-ray spectrometer (EDS) detector (not shown) to characterize the materials on wafer 203.

A primary electron beam 220 is emitted from cathode 218 lay applying a voltage between anode 216 and cathode 218. Primary electron beam 220 passes through gun aperture 214 and beam limit aperture 212, both of which may determine the size of electron beam entering condenser lens 210, which resides below beam limit aperture 212. Condenser lens 210 focuses primary electron beam 220 before the beam enters objective aperture 208 to set the size of the electron beam before entering objective lens assembly 204. Deflector 204c deflects primary electron beam 220 to facilitate beam scanning on the wafer. For example, in a scanning process, deflector 204c may be controlled to deflect primary electron beam 220 sequentially onto different locations of top surface of wafer 203 at different time points, to provide data for image reconstruction for different parts of wafer 203. Moreover, deflector 204c may also be controlled to deflect primary electron beam 220 onto different sides of wafer 203 at a particular location, at different time points, to provide data for stereo image reconstruction of the wafer structure at that location. Further, in some embodiments, anode 216 and cathode 218 may be configured to generate multiple primary electron beams 220, and electron beam tool 104 may include a plurality of deflectors 204c to project the multiple primary electron beams 220 to different parts/sides of the wafer at the same time, to provide data for image reconstruction for different parts of wafer 203.

Exciting coil 204d and pole piece 204a generate a magnetic field that begins at one end of pole piece 204a and terminates at the other end of pole piece 204a. A part of wafer 203 being scanned by primary electron beam 220 may be immersed in the magnetic held and may be electrically charged, which, in turn, creates an electric field. The electric field reduces the energy of impinging primary electron beam 220 near the surface of wafer 203 before it collides with wafer 203. Control electrode 204b, being electrically isolated from pole piece 204a, controls an electric field on wafer 203 to prevent micro-arching of wafer 203 and to ensure proper beam focus.

A secondary electron beam 222 may be emitted from the part of wafer 203 upon receiving primary electron beam 220. Secondary electron beam 222 may form a beam spot on sensor surfaces 206a and 206b of electron detector 206. Electron detector 206 may generate a signal (e.g., a voltage, a current, etc.) that represents an intensity of the beam spot, and provide the signal to an image processing system 250. The intensity of secondary electron beam 222, and the resultant beam spot, may vary according to the external or internal structure of wafer 203. Moreover, as discussed above, primary electron beam 220 may be projected onto different locations of the top surface of the wafer or different sides of the wafer at a particular location, to generate secondary electron beams 222 (and the resultant beam spot) of different intensities, Therefore, by mapping the intensities of the beam spots with the locations of wafer 203, the processing system may reconstruct an image that reflects the internal or external structures of wafer 203.

Imaging system 200 may be used for inspecting a wafer 203 on sample stage 201, and comprises an electron beam tool 104, as discussed above. Imaging system 200 may also comprise an image processing system 250 that includes an image acquirer 260, a storage 270, and controller 109. Image acquirer 260 may comprise one or more processors. For example, image acquirer 260 may comprise a computer, server, mainframe host, terminals, personal computer, any kind of mobile computing devices, and the like, or a combination thereof. Image acquirer 260 may connect with a detector 206 of electron beam tool 104 through a medium such as an electrical conductor, optical fiber cable, portable storage media, IR, Bluetooth, internet, wireless network wireless radio, or a combination thereof. Image acquirer 260 may receive a signal from detector 206 and may construct an image. Image acquirer 260 may thus acquire images of wafer 203. Image acquirer 260 may also perform various post-processing functions, such as generating contours, superimposing indicators on an acquired image, and the like. Image acquirer 260 may be configured to perform adjustments of brightness and contrast, etc. of acquired images. Storage 270 may be a storage medium such as a hard disk, random access memory (RAM), other types of computer readable memory, and the like. Storage 270 may be coupled with image acquirer 260 and may be used for saving scanned raw image data as original images, and post-processed images. Image acquirer 260 and storage 270 may be connected to controller 109. In some embodiments, image acquirer 260, storage 270, and controller 109 may be integrated together as one control unit.

In some embodiments, image acquirer 260 may acquire one or more images of a sample based on an imaging signal received from detector 206. An imaging signal may correspond to a scanning operation for conducting charged particle imaging. An acquired image may be a single image comprising a plurality of imaging areas. The single image may be stored in storage 270. The single image may be an original image that may be divided into a plurality of regions. Each of the regions may comprise one imaging area containing a feature of wafer 203.

Figure 3:
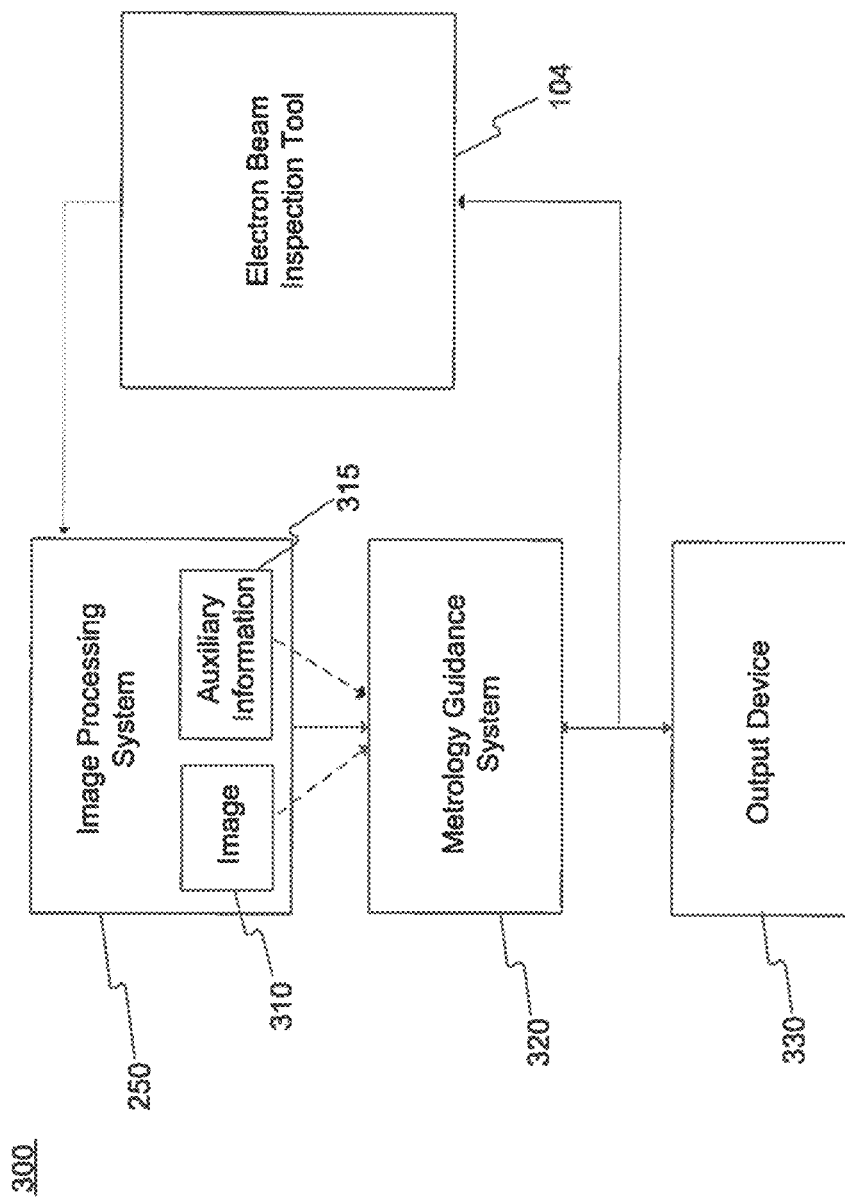
FIG. 3 is a block diagram of an exemplary metrology system, consistent with embodiments of the present disclosure.

Reference is now made to FIG. 3, which is a schematic diagram for an exemplary metrology system 300, consistent with embodiments of the present disclosure. In some embodiments, metrology system 300 comprises electron beam tool 104, image processing system 250 of FIG. 2 configured to acquire and generate an image 310, a metrology guidance system 320, and an output device 330. Alternatively, metrology system 300 may be a part of imaging system 200 of FIG. 2 or EBI system 100 of FIG. 1.

Image 310 may include a high-resolution e-beam image of a pattern on a sample. As used herein, high resolution e-beam image refers to, but is not limited thereto, an image having a resolution high enough to resolve two distinct features in the image having a spacing less than 20 nm. Image 310 may be acquired using image acquirer 260 of image processing system 250 or any such system capable of acquiring high resolution images. Image 310 may be acquired by any e-beam inspection system that may generate an inspection image of a wafer. The wafer may be a semiconductor wafer substrate, or a semiconductor wafer substrate having one or more epi-layers or process films, for example. The embodiments of the present disclosure do not limit the specific type of an inspection system as long as the system may generate a wafer image having an adequate resolution.

In some embodiments, image 310 may be a review-mode image, which is an image acquired under acquisition conditions intended to be optimal. The review-mode image may have a higher resolution, for example, optimized magnification, optimized contrast and brightness, optimized e-beam intensity, etc. Detector 206 settings may also be optimized to acquire high resolution images.

In some embodiments, image 310 may be a low-resolution image of a sample, or a feature of wafer 203, wafer 203, or a region of interest on wafer 203, for example. Image 310 may be acquired using image acquirer 260 of image processing system 250 or any such system capable of acquiring low resolution images. Image 310 may be acquired by any e-beam inspection system that may generate an inspection image of a wafer or a region of interest on the wafer. Wafer 203 may be a semiconductor wafer substrate, or a semiconductor wafer substrate having one or more epi-layers or process films, for example.

Image 310 may include, for example, a reference image of a location on wafer 203, or a reference image of a feature on wafer 203, or a post-processing reference image, or the like. In some embodiments, image 310 may comprise multiple images including reference images of locations or features from wafers of multiple product types. For example, when multiple product types are fabricated in the same fab line using the same processes, a reference image of a feature from a first product type may be used as a training image for the feature from a second product type having a different build compared to the first product type.

Image 310 may be stored in storage 270 of image processing system 250. Image 310 may also be stored in a remote storage location (not illustrated), for example, a remote database, a network, a server, a cloud platform, or the like, accessible by components of metrology system 300, including metrology guidance system 320.

In some embodiments, auxiliary information 315 may be transferred to metrology guidance system 320. Auxiliary information 315 may include target information associated with imaging conditions or critical dimension uniformity settings, for example, target critical dimensions, target pitch of a pattern, target measurement precision, etc. As used herein, a "critical dimension" refers to the size of a feature of an IC or transistor that impacts the electrical properties of a device. For example, width of a wire, spacing between two wires, geometry of a channel or electrode of a field-effect transistor (e.g., a gate that has a different dimension compared to the channel and that does not span the full width of the channel), etc. The dimensions of each of the components of a field-effect transistor may be critical dimensions. These dimensions can all influence the electrical performance of the device because they may contribute parasitic capacitance and resistance. It is appreciated that critical dimensions are dimensions that may be adjusted to optimize device performance and yield manufacturing.

In some embodiments, auxiliary information 315 may include information that is pre-determined based on the product or the process. For example, a target critical dimension measurement precision of 0.1 nm may be set for a field-effect transistor having a critical dimension of 22 nm for the channel length. Alternatively, target information in auxiliary information 315 may be adjusted based on the tool physical conditions, process parameters, product dimensions, etc. Other suitable target measurement precision values may be suitably applied.

In some embodiments, auxiliary information 315 may be stored in storage 270 of image processing system 250. Auxiliary information 315 may also be stored in a remote storage location (not illustrated), for example, a remote database, a network, a server, a cloud platform, or the like, accessible by components of metrology system 300, including metrology guidance system 320.

As illustrated in FIG. 3, metrology guidance system 320 may be coupled with image processing system 250 as a separate unit. Alternatively, metrology guidance system 320 may be a part of image processing system 250, or imaging system 200, or EBI system 100. Metrology guidance system 320 may be configured to analyze information including, but not limited to, image 310 and auxiliary information 315, and output guidance parameters including recommendations for imaging conditions and critical dimension uniformity settings. In some embodiments, metrology guidance system 320 may also be configured to receive acquired image 310 and auxiliary information 315 and to analyze the received image and information to provide guidance parameters, for example, imaging condition and critical dimension uniformity settings recommendations.

In some embodiments, metrology guidance system 320 is configured to receive image 310 and auxiliary information 315 from image processing system 250. In other embodiments, metrology guidance system 320 is configured to receive image 310 and auxiliary information 315 from storage 270 or other storage media.

In some embodiments, metrology guidance system 320 may be coupled directly with electron beam tool 104. The guidance parameters provided by metrology guidance system 320 may be directly received by electron beam tool 104 and implemented for successive inspection runs, without user verification. In some embodiments, guidance parameters provided by metrology guidance system 320 may be displayed on output device 330 for the user to verify the guidance parameters.

Output device 330 may be configured to display the guidance parameters provided by metrology guidance system 320. The guidance parameters may comprise a text file, an image of parameter recommendations, an audio-visual file, or combinations thereof. In some embodiments, output device 330 may be coupled with electron beam tool 104, and the guidance parameters may be received by electron beam tool 104.

In some embodiments, output device 330 may be a part of image processing system 250 configured to display image 310 or auxiliary information 315. Output device 330 may be connected to other components of image processing system 250 including, but not limited to, storage 270, controller 109, and the like. It is appreciated that output device 330 may be a part of image acquirer 260 of FIG. 2. In some embodiments, output device 330 may comprise a handheld display device, a wearable display device, a multi-screen display, an interactive display device, or the like. Other suitable display devices may be used as well.

FIG. 4 illustrates an exemplary metrology system 400, consistent with embodiments of the present disclosure. In some embodiments, metrology system 400 comprises image processing system 250 of FIG. 2 including image acquirer 260, storage 270, controller 109, and the like. Alternatively, image processing system 250 may comprise metrology system 400, including metrology guidance system 320.

As illustrated in FIG. 4, image 310 is a high-resolution e-beam image acquired by image acquirer 260 of image processing system 250, for example. Image 310 shows a pattern including a uniform array of vertical features separated by spacing. The vertical features may comprise, for example, lines of photoresist, or dielectric material; or interconnect metal lines, etc. The spacing may comprise a surface of wafer 203, or underlying substrate material, or protective layer, etc. The vertical features shown in image 310 have an irregular line shape and edge profile. Although, image 310 is a high-resolution image, there may be a low but finite amount of noise level present. After acquisition, image 310 may be directly transferred to metrology guidance system 320. In some embodiments, image 310 may be stored temporarily in storage (e.g., storage 270 of FIG. 2) prior to being transferred to metrology guidance system 320.

Database 410 may be configured to store auxiliary information 315. Database 410 may also store image 310 or other related information, for example, guidance parameters, quality metrics, etc. In some embodiments, database 410 may be directly coupled with metrology guidance system 320. Database 410 may include, for example, Oracle™ databases, Sybase™ databases, relational databases, or non-relational databases, such as Hadoop™ sequence files, HBase™ or Cassandra™. Database 410 may include competing components (e.g., database management system, database server, etc.) configured to receive and process requests for data stored in memory devices of database 410 and to provide, data from database 410. In some embodiments, database 410 may take the form of a server, a computer, a mainframe computer, or any combination of these components. Other implementations consistent with disclosed embodiments are possible as well.

Metrology guidance system 320 may include an image analysis module 420, a processor 430, and a memory 440. Metrology guidance system 320 may also include other components, not illustrated herein, for example, a simulator, graphic user interface, databases, etc. In some embodiments, output device 330 may be a part of metrology guidance system 320.

In some embodiments, image analysis module 420 is configured to receive acquired image 310. Image analysis module 420 may receive acquired image 310 in a suitable format, for example, a JPEG file, a PNG file, a PDF file, a TIFF file, a BMP file, etc. Other suitable formats of images may also be used. Image analysis module 420 may receive image 310 from one or more sources, including, but not limited to, storage 270, database 410, and the like.

Image analysis module 420 may further be configured to perform analysis and assessment of the received image 310. Based on the analysis and assessment of image 310, image analysis module 420 may infer a set of image parameters. The set of image parameters may comprise noise levels, pattern pitch, pattern yield, line roughness, etc. The inferred set of image parameters may be stored in database 410, storage 270, or the like. Image analysis module 420 may comprise a computer, a software-implemented algorithm, image processing algorithm, or a feature extraction algorithm, or the like.

Metrology guidance system 320 may include processor 430. Processor 430 may be configured to execute the set of instructions to cause metrology guidance system 320 to perform associated functions. Processor 430 may comprise a computing unit, a computer, a programmable IC circuit, a mainframe computer, a server, etc. Processor 430 may be coupled with image analysis module 420, either through a wired connection or wirelessly. In some embodiments, image analysis module 420 may be a part of processor 430.

In some embodiments, processor 430 of metrology guidance system 320 may include memory 440. Memory 440 may be configured to store instructions for processor 430. Memory 440 may comprise a non-volatile memory, random access memory (RAM), dynamic random access memory (DRAM), static random access memory (SRAM), read-only memory (ROM), flash memory, and the like. Metrology guidance system 320 may comprise one or more memories (e.g., memory 440) based on, for example, the volume of data and information that needs to be processed, or as desired.

In some embodiments, processor 430 may be configured to receive image 310, perform analysis of image 310, and infer a set of image parameters based on the analysis of image 310. The set of image parameters may comprise noise levels, pattern pitch, pattern yield, line roughness, etc. The inferred set of image parameters may be stored in database 410, storage 270, or the like. Processor 430 may be further configured to determine a set of model parameters from the set of image parameters based on quality metrics, including, but not limited to, local noise levels, global noise levels, edge profile statistics, critical dimensions, and pattern structure. Processor 430 may be further configured to generate one or more simulated images based on the set of model parameters, perform measurements of critical dimensions on the simulated image, and compare the measured critical dimensions with the set of model parameters. Based on the comparison results, metrology guidance system 320 may output guidance parameters including recommendations for imaging conditions and critical dimension uniformity settings.

Metrology system 400 may include output device 330 configured to display guidance parameters and recommendations for imaging conditions and critical dimension uniformity settings based on the comparison of measured critical dimensions with the set of model parameters.

In some embodiments, output device 330 may be a part of image processing system (e.g., image processing system 250 of FIG. 2). In some embodiments, output device 330 may comprise a handheld display device, at wearable display device, a multi-screen display, an interactive display device, or the like. Other suitable display devices may be used as well.

Figure 5:
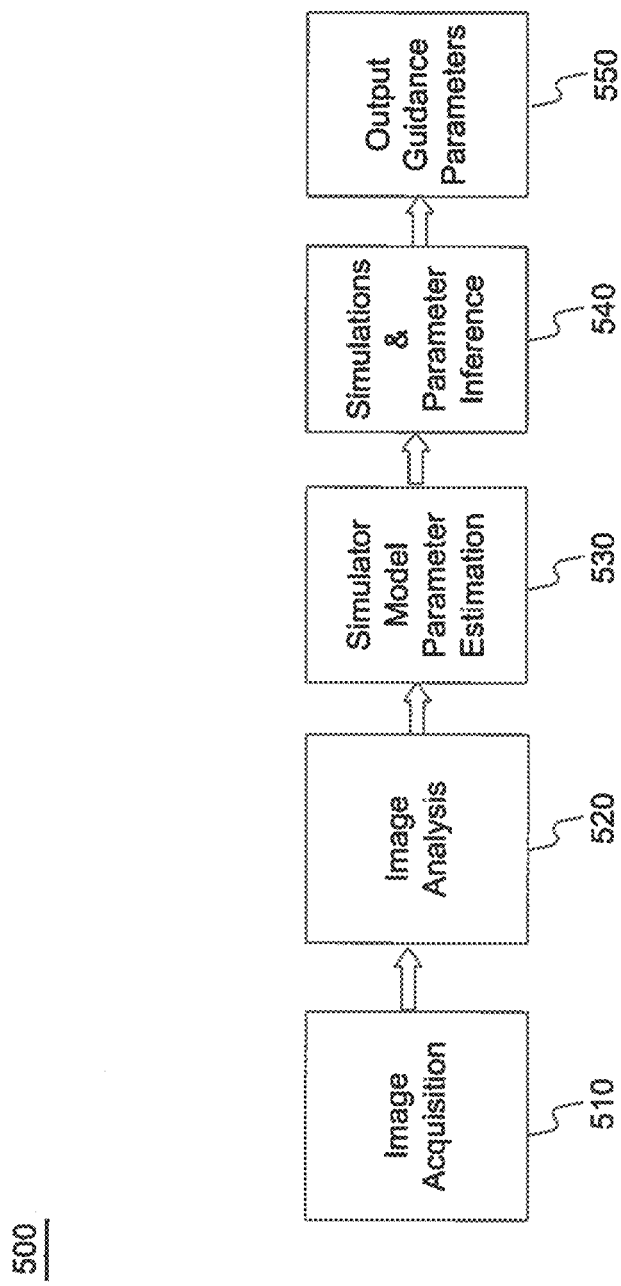
FIG. 5 is a flow chart illustrating an exemplary metrology guidance method, consistent with embodiments of the present disclosure.

FIG. 5 is a flow chart illustrating an exemplary metrology guidance method 500 consistent with embodiments of the present disclosure. The metrology guidance method may be performed by metrology guidance system 320 that may be coupled with a charged particle beam apparatus, including EBI system 100. It is appreciated that the charged particle beam apparatus may be controlled to image wafer 203 or a region of interest on the wafer. Imaging may comprise scanning wafer 203 to image at least a portion of the wafer, a pattern on the wafer, or wafer 203 itself.

In step 510, one or more scanned raw images of the pattern may be acquired. The one or more scanned raw images may comprise the entire surface of the wafer. Image acquisition in step 510 may comprise receiving signals from a detector of the charged particle beam apparatus, such as electron detector 206 of electron beam tool 104, or loading image alt from storage 270. Image acquirer 260 of image processing system 250 may be used to acquire image 310.

In step 520, image 310 may be analyzed by image analysis module 420. Image analysis module 420 may receive the acquired image from image acquirer 260, storage 270, database 410, etc. Image analysis in step 520 may include determining one or more image parameters of acquired image 310. Image parameters may include noise levels, pattern, pitch of a pattern, line roughness, edge profiles, etc. (e.g., noise levels, pattern, pitch, edge profile, in image 310 of FIG. 4). Image analysis module 420 may determine image parameters using a feature extraction algorithm, an image recognition algorithm, a deep learning neural network processor, a machine learning algorithm, or a combination thereof. In some embodiments, image analysis module 420 may be integrated within processor 430 of metrology guidance system 320. In some embodiments, processor 430 may be configured to perform one or more functions of image analysis module 420.

In step 530, processor 430 of metrology guidance system 320 may be configured to determine one or more model parameters from the image parameters, based on quality metrics. The model parameters may be estimated based on quality metrics. The quality metrics may comprise parameter values based on internal quality control and standards, historical results, performance metrics, etc. The quality metrics may be specific to a product, or a process, or combinations thereof. The quality metrics may be predefined and stored in database 410 and accessed by a user through a user input, for example, by executing a query, a command, or the like. In some embodiments, quality metrics may comprise a preferred range of values for one or more parameters. For example, quality metrics may comprise a range of acceptable local and global noise levels, or a range of acceptable range of percentage deviations for the edge profile, or critical dimensions of a pattern, etc.

The image parameters determined in step 520 may be compared against the quality metrics to determine whether the image parameters are in-range or out-of-range. For example, critical dimension of a pattern determined (e.g., using image analysis module 420 of FIG. 4, processor 430 of FIG. 4, etc.) may fall outside the acceptable range for the process, the acceptable range identified herein as one the quality metrics. If the critical dimension of a pattern in its 310 is determined to be out-of-range, image 310 may be re-analyzed in step 520. Alternatively, metrology guidance system 320 may suggest re-acquisition of a representative image, or re-work of the sample, Metrology guidance system 320 may also suggest flagging electron beam tool 104, image acquirer 260, or EBI system 100 for further inspection and performance verification.

In step 540, metrology guidance system 320 may generate one or more simulated images simulated images 655 of FIG. 6, discussed later) using the model parameters. The images may be simulated using processor 430 of metrology guidance system 320. In some embodiments, a simulator (not shown) may be configured to simulate images. The simulator may be a part of metrology guidance system 320, a part of processor 430, etc. After simulated images are generated, metrology guidance system 320 may be configured to measure critical dimensions of simulated images. The measured critical dimensions may be compared with the model parameters to determine guidance parameter recommendations. The guidance parameters may comprise recommendations on imaging conditions, critical dimension uniformity settings, etc. In some embodiments, step 540 may include the steps of building model ground truth based on model parameters, generating simulated images, performing critical dimension measurements, and comparing the critical dimension measurements with the model ground truth to determine guidance parameter recommendations. These individual steps are discussed later in the discussion of FIG. 6.

In step 550, the guidance parameter recommendations may be output, such as by being displayed on a display (e.g., output device 330 of FIG. 3), by being output to a text file or database, by being output to a charged particle beam apparatus (e.g., by being sent over a communications medium to the charged particle beam apparatus), etc. In some embodiments, guidance parameters may include, but are not limited to, adjust field of view, increase number of averaging pixels, increase number of images needed to achieve target precision, threshold for critical dimension uniformity, etc. The guidance parameters may be displayed on multiple displays simultaneously. The guidance parameters may be reviewed by a user or a group of users and implemented based on approval. In some embodiments, the recommendations provided by metrology guidance system 320 in step 550 may be directly implemented without user approval.

Figure 6:
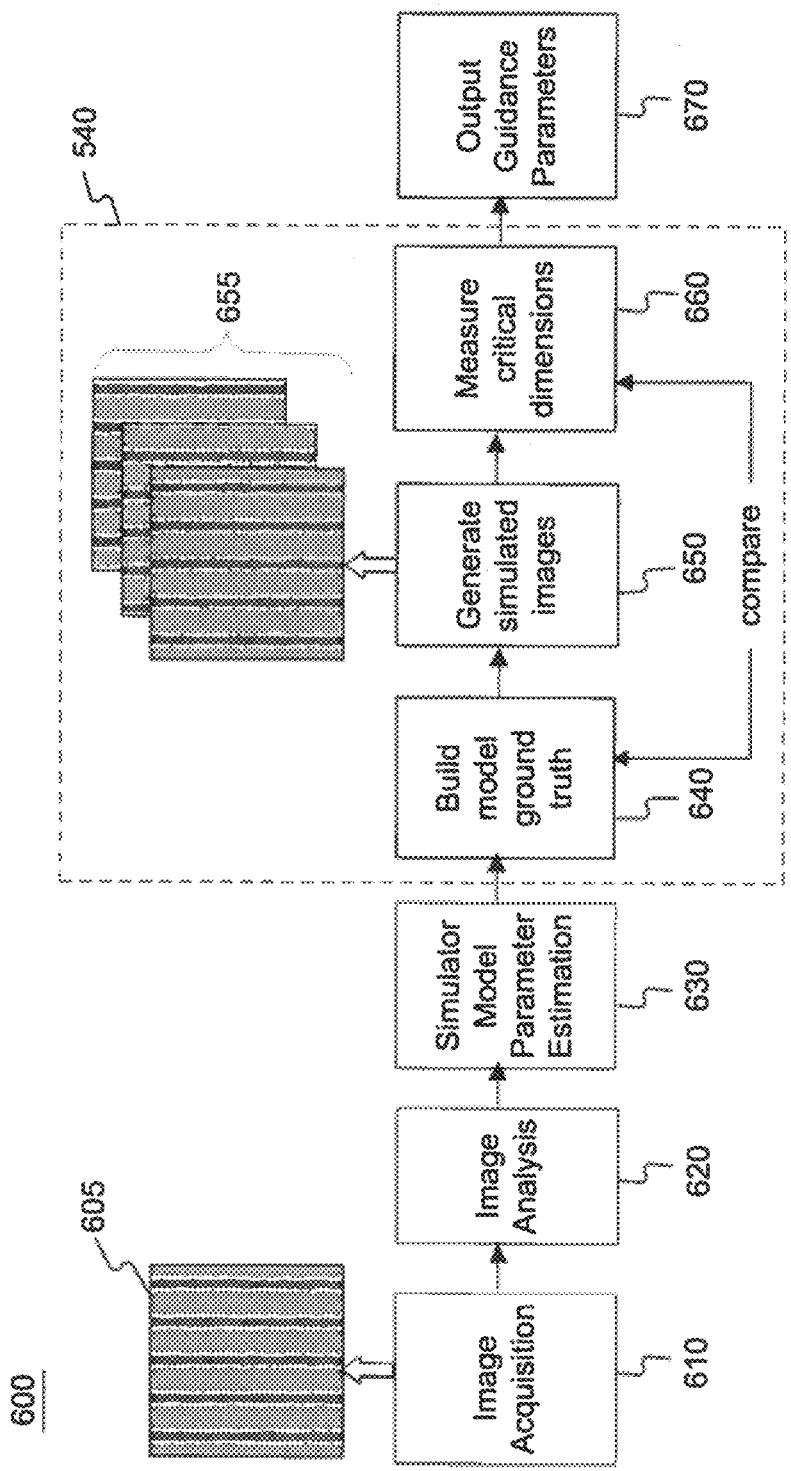
FIG. 6 is a flow chart showing metrology guidance method using a simulator, consistent with embodiments of the present disclosure.

FIG. 6 is a flow chart illustrating an exemplary metrology guidance method 600 consistent with embodiments of the present disclosure. The metrology guidance method may be performed by metrology guidance system 320, which may be coupled with a charged particle beam apparatus, including EH system 100. It is appreciated that the charged particle beam apparatus may be controlled to image wafer 203 or a region of interest on the wafer. Imaging may comprise scanning wafer 203 to image at least a portion of the wafer, a pattern on the wafer, or wafer 203 itself.

In step 610, one or more scanned raw images of the pattern may be acquired. The one or more scanned raw images may comprise the entire surface of the wafer. Image acquisition in step 610 may comprise receiving signals from a detector of the charged particle beam apparatus, such as electron detector 206 of electron beam tool 104, or loading image 605 from storage 270. Image acquirer 260 of image processing system 250 may be used to acquire image 605.

In some embodiments, image 605 is a top plan view of a high-resolution e-beam image, acquired with optimized acquisition conditions, for example, e-beam settings, magnification, brightness, contrast, detector settings, etc. As illustrated in FIG. 6, image 605 shows a regular pattern including a uniform array of vertical features separated by a uniform spacing. The vertical features may comprise, for example, lines of photoresist, tar dielectric material, or interconnect metal lines, etc. The spacing may comprise surface of wafer 203, or underlying substrate material, or a protective layer, etc.

The vertical features shown in image 605 have an irregular line shape and an irregular edge profile. The irregularities in line shape refers to the protrusions and recessions in vertical features along vertical axis "y". For example, the irregularities may be Caused due to non-optimized photoresist exposure conditions, non-optimized photoresist stripping conditions, or could be an artifact of non-optimized imaging conditions. The edge profile refers to the profile in the z dimension (i.e., the dimension perpendicular to the surface of wafer 203) of the material comprising the edges of vertical features. The edges of vertical features may be thicker than the central portion of the corresponding vertical feature. The edge profile may be better represented by a cross-sectional view of image 605 (not shown).

Although, image 605 is as high-resolution image, there may be a low hut finite amount of noise level present. The noise levels may be contributed by local and global factors, including, but not limited to, ground vibrations, acoustic interferences, e-beam filters, impurities in detectors, etc. Other sources of local and global noise may be present as well.

In step 620, image 605 is analyzed by image analysis module 420, or processor 430, or metrology guidance system 320, or a combination thereof. As am example, image analysis module 420 may receive the acquired image from image acquirer 260, storage 270, database 410, etc. Image analysis in step 520 may include determining one or more image parameters of image 310. Image parameters may include noise levels, pattern, pitch of a pattern, line roughness, edge profiles, etc. (e.g., noise levels, pattern, pitch, edge profile, in image 310 of FIG. 4). Image analysis module 420 may determine image parameters using a feature extraction algorithm, an image recognition algorithm, a deep learning neural network processor, a machine learning algorithm, or a combination thereof. In some embodiments, image analysis module 420 may be integrated within processor 430 of metrology guidance system 320. In some embodiments, processor 430 may be configured to perform one or more functions of image analysis module 420.

In step 630, metrology guidance system 320 may be configured to estimate the model parameters from the image parameters based on quality metrics. The quality metrics may comprise parameter values based on internal quality control and standards, historical results, performance metrics, etc. The quality metrics may be specific to a product, or a process, or combinations thereof. The quality metrics may be pre-defined and stored in database 410 and accessed by a user through a user input, for example, by executing a query, a command, or the like. In some embodiments, quality metrics may comprise a preferred range of values for one or more parameters. For example, quality metrics may comprise a range of acceptable local and global noise levels, or a range of acceptable range of percentage deviations for the edge profile, or critical dimensions of a pattern, etc.

In some embodiments, quality metrics may be updated based on iterative correction of guidance parameters from simulated images. For example, metrology guidance system 320 may provide a first set of guidance parameter recommendations that may be stored (e.g., in database 410 of FIG. 4) and utilized for the acquisition of next input image or critical dimension measurement of simulated image.

During metrology setup of EBI system 100 or electron beam tool 104, a user is required to choose multiple parameters and multiple selections of each parameter to control image acquisition and critical dimension measurement. The parameters may include size of field of view, pixel size, number of images, number of H-bars, size of H-bars, etc. As used herein, a H-bar may comprise a dimension measurement tool in a dimension measurement software or application configured to measure planar or non-planar dimensions in an acquired image (e.g., image 310).

In step 640, metrology guidance system 320 may build model ground truth parameters from the image parameters determined in step 620 or model parameters estimated in step 630. In some embodiments, model ground truth parameters may include image acquisition parameters as well. The model ground truth parameters represent "actual" values of image parameters or acquisition parameters rather than empirically chosen values by a user or a group of users, for example, number of averaging pixels, or number of H-bars, or size of field of view, etc. The model ground truth parameters may include ground truth knowledge of tool physical conditions (e.g., electron beam tool 104 of FIG. 3) and statistical data associated with underlying samples.

In step 650, the model ground truth parameters may be utilized by metrology guidance system 320 to generate simulations or simulated images 655. In some embodiments, a simulator may be configured to simulate images. The simulator may be a part of metrology guidance system 320, or a part of processor 430, or processor 430 itself. It is appreciated that the simulator may generate just one simulated image 655 or multiple simulated images 655, as desired. Simulated images 655 may comprise duplicates of each other, or slight variations from each other, or combinations thereof. Duplicate simulated images 655 may be useful in measuring multiple dimensions or parameters for a set of simulation model parameters, for example, H-bars on the first image, edge profile on the second image, line roughness on the third image, etc.

As illustrated in FIG. 6, simulated images 655 may be substantially similar to image 310 to replicate acquisition conditions and critical dimension uniformity settings of image 310.

In step 660, metrology guidance system 320 may perform measurements of critical dimensions on simulated images 655. Multiple measurements may be performed to obtain statistical data of critical dimensions. The measurement results may be stored temporarily in storage (e.g., database 410 of FIG. 4) and accessed later using a user input.

Step 660 may also comprise comparing the measured critical dimensions on simulated images 655 with the model ground truth parameters from step 640. Metrology guidance system 320 may be configured to determine the difference between the measured critical dimensions and model ground truth parameters utilized to generate simulated images 655.

In step 670, metrology guidance system 320 may be configured to provide guidance parameter recommendations for inspection tool, for example, EBI system 100, electron beam tool 104, image processing system 250, controller 109, etc. based on the comparison results from step 660. The guidance parameter recommendations may include, but are not limited to, adjust field of view, increase number of averaging pixels, increase number of images needed to achieve target precision, threshold for critical dimension uniformity, etc.

The guidance parameter recommendations may be displayed on a display (e.g., output device 330 of FIG. 3). The guidance parameters may be displayed on multiple displays simultaneously. The guidance parameters may be reviewed by a user or a group of users and implemented based on approval. In some embodiments, the recommendations provided by metrology guidance system 320 in step 670 may be directly implemented without user approval.

Figure 7:
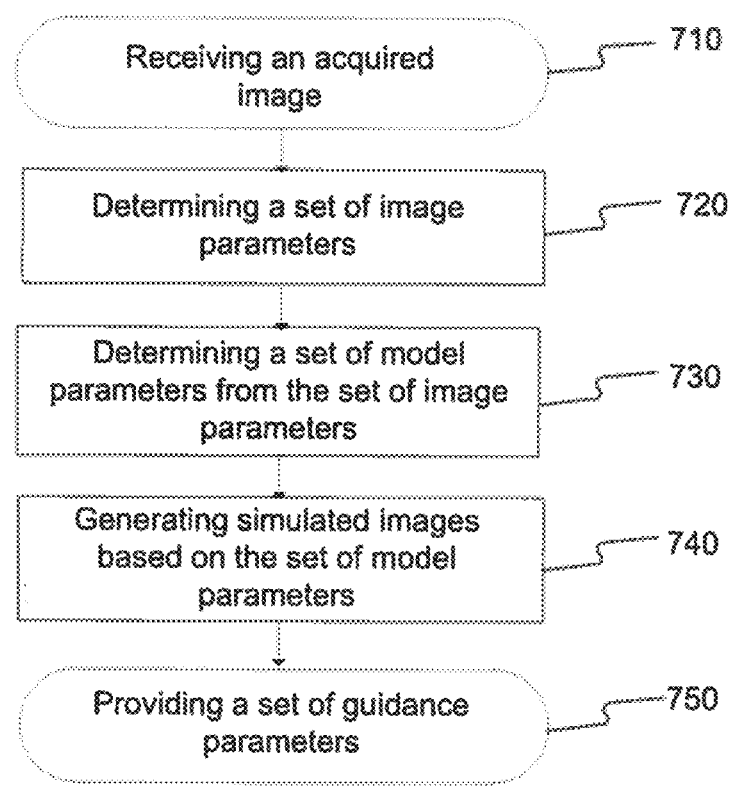
FIG. 7 is a process flow chart illustrating an exemplary metrology guidance method consistent with embodiments of the present disclosure.

FIG. 7 is a process flow chart illustrating an exemplary metrology guidance method 700 consistent with embodiments of the present disclosure. The metrology guidance method may be performed by metrology guidance system 320 that may be coupled with a charged particle beam apparatus, such as EBI system 100 or electron beam tool 104. It will be appreciated that the charged particle beam apparatus may be controlled to image wafer 203 or a region of interest on the wafer. Imaging may comprise scanning wafer 203 to image at least a portion of the wafer, a pattern on the wafer, or wafer 203 itself.

In step 710, a system, such as metrology guidance system 320, or a module, such as image analysis module 420 of metrology guidance system 320, receive an acquired image (e.g., image 310 of FIG. 4). Image acquisition may comprise receiving signals from a detector of the charged particle beam apparatus, such as electron detector 206 or electron beam tool 104, or loading image 310 from storage 270. Image acquirer 260 of image processing system 250 may be used to acquire image 310. Image analysis module 420 may receive the acquired image from image acquirer 260, storage 270, database 410, etc.

In step 720, the received image may be analyzed by the system or the module to determine one or more image parameters. Image parameters may include noise levels, pattern, pitch of a pattern, line roughness, edge profiles, etc. (e.g., noise levels, pattern, pitch, edge profile, in image 310 of FIG. 4). Image analysis module 420 may determine image parameters from the received image using a feature extraction algorithm, an image recognition algorithm, a deep learning neural network processor, a machine learning algorithm, or a combination thereof. In some embodiments, a machine learning network may be trained to determine a set of image parameters from the received image. The machine learning network may comprise a convolutional neural network, for example. In some embodiments, a linear classifier network of deep learning architecture may be adopted as a starting point to train and build image feature recognition architecture of the machine learning network. In some embodiments, image analysis module 420 may be integrated within processor 430 of metrology guidance system 320. In some embodiments, processor 430 may be configured to perform one or more functions of image analysis module 420.

In step 730, the system or the module may be configured to determine model parameters from the image parameters, such as based on quality metrics. The quality metrics may comprise parameter values based on internal quality control and standards, historical results, performance metrics, etc. The quality metrics may be specific to a product, or a process, or combinations thereof. The quality metrics may be pre-defined and stored in a storage (e.g., database 410) and accessed by a user through a user input, for example, by executing a query, a command, or the like. In some embodiments, quality metrics may comprise a preferred range of values for one or more parameters. For example, quality metrics may comprise a range of acceptable local and global noise levels, or a range of acceptable range of percentage deviations for the edge profile, or critical dimensions of a pattern, etc.

In some embodiments, a machine learning network may be trained to determine the model parameters from the image parameters. The model parameters may be determined from the image parameters, for example, by a deep learning neural network processor, a mathematical algorithm, a software-implemented algorithm, a machine learning algorithm, or combination thereof. The machine learning network may comprise a convolutional neural network, for example. In some embodiments, a linear classifier network of deep learning architecture may be adopted as a starting point to train and build the set of model parameters. In some embodiments, the image parameters and the model parameters may be determined using a machine learning network.

In step 740, the system or the module may generate simulated images (e.g., simulated images 655 of FIG. 6) using the model parameters. The images may be simulated using processor 430 of metrology guidance system 320. In some embodiments, a simulator (not shown) may be configured to simulate images. The simulator may be a part of metrology guidance system 320 or a part of processor 430. After simulated images are generated, metrology guidance system may be configured to measure critical dimensions of simulated images. The measured critical dimensions may be compared with the model parameters to determine guidance parameter recommendations. The guidance parameters may comprise recommendations on imaging conditions, critical dimension uniformity settings, etc. In some embodiments, step 740 may include the steps of building a model ground truth based on model parameters, generating simulated images, performing critical dimension measurements, and comparing the critical dimension measurements with the model ground truth to determine guidance parameter recommendations.

In step 750, the system or the module may be configured to provide guidance parameter recommendations for inspection tool, for example, EBI system 100, electron beam tool 104, image processing system 250, controller 109, etc. based on the comparison results from step 740. The guidance parameter recommendations may include, but are not limited to, adjust field of view, increase number of averaging pixels, increase number of images needed to achieve target precision, threshold for critical dimension uniformity, etc.

The guidance parameter recommendations may be output, such as by being displayed on a display (e.g., output device 330 of FIG. 3). The guidance parameters may be displayed on multiple displays simultaneously. The guidance parameters may be reviewed by a user or a group of users and implemented based on approval. In some embodiments, the recommendations provided by metrology guidance system 320 in step 750 may be directly implemented without user approval.

The embodiments may further be described using the following clauses:

1. A metrology system comprising:
a memory storing a set of instructions; and
a processor configured to execute the set of instructions to cause the metrology system to:
receive an acquired image of a sample;
determine a set of image parameters based on an analysis of the acquired image;
determine a set of model parameters based on the set of image parameters;
generate a set of simulated images based on the set of model parameters; and
output a set of guidance parameters based on an analysis of the set of simulated images and the set of model parameters.

2. The system of clause 1, further comprising a charged particle beam apparatus configured to acquire art image of the sample.

3. The system of any one of clauses 1 and 2, wherein the set of simulated images includes only a single simulated image.

4. The system of any one of clauses 1 to 3, wherein the analysis comprises a comparison of information from the set of simulated images and the set of model parameters.

5. The system of clause 4, wherein the information from the set of simulated images comprises critical dimension measurement results.

6. The system of any one of clauses 1 to 5, wherein at least one of the set of image parameters, the set of model parameters, or the set of guidance parameters comprises a single parameter.

7. The system of any one of clauses 1 to 6, wherein the set of image parameters comprises any of noise levels, pattern of interest, line roughness, or edge profile.

8. The system of any one of clauses 1 to 7, wherein the set of model parameters is determined from the set of image parameters based on a quality metric.

9. The system of clause 8, wherein the set of model parameters being determined from the set of image parameters is based on a plurality of quality metrics.

10. The system of clause 9, wherein the plurality of quality metrics comprises any of local noise level, global noise level, edge profile statistics, or pattern structure.

11. The system of any one of clauses 1 to 10, wherein the set of guidance parameters comprises any of recommended imaging parameter, critical dimension uniformity parameter, measurement precision, repeatability, or measurement accuracy.

12. The system of any one of clauses 1 to 11, wherein the processor is configured to execute the set of instructions to further cause the metrology system to:
receive auxiliary information associated with target parameters; and
analyze the acquired image based on the received auxiliary information.

13. The system of clause 12, wherein the target parameters comprise any of targeted pitch, targeted critical dimension uniformity, targeted pattern, or targeted measurement precision.

14. The system of any one of clauses 1 to 13, wherein the processor is configured to execute the set of instructions to further cause the metrology system to:
perform measurement of a critical dimension of the set of simulated images to obtain critical dimension measurements; and
compare the critical dimension measurements with the set of model parameters.

15. A metrology guidance system comprising:
a memory storing a set of instructions; and
a processor configured to execute the set of instructions to cause the metrology guidance system to:
determine a set of image parameters based on an analysis of an acquired image;
determine a set of model parameters based on the set of image parameters;
generate a set of simulated images based on the set of model parameters;
analyze the set of simulated images; and
output a set of guidance parameters based on an analysis of the set of simulated images and the set of model parameters.

16. The system of clause 15, wherein the set of simulated images includes only a single simulated image.

17. The system of any one of clauses 15 and 16, wherein the analysis comprises a comparison of information from the set of simulated images and the set of model parameters.

18. The system of clause 17, wherein the information from the set of simulated images comprises critical dimension measurement results.

19. The system of any one of clauses 15 to 18, wherein at least one of the set of image parameters, the set of model parameters, or the set of guidance parameters comprises a single parameter.

20. The system of any one of clauses 15 to 19, wherein analyzing the simulated image further comprises:
performing measurement of critical dimensions on the set of simulated images; and critical dimension measurements with the set of model parameters.

21. The system of any one of clauses 15 to 20, wherein the set of image parameters comprises any of noise levels, pattern of interest, line roughness, or edge profile.

22. The system of any one of clauses 15 to 21, wherein the set of model parameters is determined from the set of image parameters based on a quality metric.

23. The system of clause 22, wherein the set of model parameters being determined from the set of image parameters is based on a plurality of quality metrics.

24. The system of clause 23, wherein the plurality of quality metrics comprises any of local noise level, global noise level, edge profile statistics, or pattern structure.

25. The system of any one of clauses 15 to 24, wherein the set of guidance parameters comprises any of recommended imaging parameter, critical dimension uniformity parameter, measurement precision, repeatability, or measurement accuracy.

26. The system of any one of clauses 15 to 25, wherein the processor is configured to execute the set of instructions to further cause the metrology guidance system to:
receive auxiliary information associated with target parameters; and
analyze the acquired image based on the received auxiliary information.

27. The system of clause 26, wherein the target parameters comprise any of targeted pitch, targeted critical dimension uniformity, targeted pattern, or targeted measurement precision.

28. A metrology guidance method comprising:
receiving an acquired image of a sample;
determining a set of image parameters based on an analysis of the acquired image;
determining a set of model parameters based on the set of image parameters;
generating a set of simulated images based on the set of model parameters; and
providing a set of guidance parameters based on an analysis of the set of simulated images and the set of model parameters.

29. The method of clause 28, wherein the set of simulated images includes only a single simulated image.

30. The method of arty one of clauses 28 and 29, comprising providing the set of guidance parameters based on the analysis of the set of simulated images and the set of model parameters.

31. The method of any one of clauses 28 to 30, wherein the analysis comprises a comparison of information from the set of simulated images and the set of model parameters.

32. The method of clause 31, wherein the information from the set of simulated images comprises critical dimension measurement results.

33. The method of any one of clauses 28 to 32, wherein the at least one of the set of image parameters, the set of model parameters, or the set of guidance parameters comprises a single parameter.

34. The method or any one of clauses 28 to 33, wherein the set of model parameters are determined from the set of image parameters based on a quality metric.

35. The method of clause 34, wherein the set of model parameters being determined from the set of image parameters is based on a plurality of quality metrics.

36. The method of clause 35, wherein the plurality of quality metrics comprises any of local noise level, global noise level, edge profile statistics, or pattern structure.

37. The method of any one of clauses 28 to 36, wherein the set of image parameters comprises any of noise levels, pattern of interest, line roughness, or edge profile.

38. The method of any one of clauses 28 to 37, wherein the set of guidance parameters comprises any of recommended imaging parameter, critical dimension uniformity parameter, measurement precision, repeatability, or measurement accuracy.

39. The method of any one of clauses 28 to 38, further comprising:
receiving auxiliary information associated with target parameters; and
analyzing the acquired image based on the received auxiliary information.

40. The method of clause 39, wherein the target parameters comprise any of targeted pitch, targeted critical dimension uniformity, targeted pattern, or targeted measurement precision.

41. The method of any one of clauses 28 to 40, further comprising:
performing measurement of critical dimensions on the set of simulated images; and
comparing critical dimension measurements with the set of model parameters.

42. A non-transitory computer readable medium comprising a set of instructions that are executable by one or more processors of an apparatus to cause the apparatus to perform a method comprising:
receiving an acquired image of a sample;
determining a set of image parameters based on an analysis of the acquired image;
determining a set of model parameters based on the set or image parameters;
generating a set or simulated images based on the set of model parameters; and
providing a set of guidance parameters based on an analysis of the set of simulated images and the set of model parameters.

43. The computer readable medium of clause 42, wherein the set of instructions further cause the apparatus to:
perform measurement of critical dimensions on the set of simulated images; and
compare critical dimension measurements with the set of model parameters.

44. The computer readable medium of any one of clauses 42 and 43, wherein the set of instructions further cause the apparatus to:
receive auxiliary information associated with target parameters and analyze the acquired image based on the received auxiliary information.

A non-transitory computer readable medium may be provided that stores instructions for a processor (for example, processor of controller 109, processor 430) to carry out image acquisition, image analysis, image simulations using modeling data, data processing, database management, graphical display, operations of a charged particle beam apparatus, or other imaging device, etc. Common forms of non-transitory media include, for example, a floppy disk, a flexible disk, hard disk, solid state drive, magnetic tape, or any other magnetic data storage medium, a Compact Disc Read Only Memory (CD-ROM), any other optical data storage medium, any physical medium with patterns of holes, a Random Access Memory (RAM), a Programmable Read Only Memory (PROM), and Erasable Programmable Read Only Memory (EPROM), a FLASH-EPROM or any other flash memory, Non-Volatile Random Access Memory (NVRAM), a cache, a register, any other memory chip or cartridge, and networked versions of the same.

The block diagrams in the figures illustrate the architecture, functionality, and operation of possible implementations of systems, methods, and computer hardware or software products according to various exemplary embodiments of the present disclosure. In this regard, each block in a flowchart or block diagram may represent a module, segment, or portion of code, which comprises one or more executable instructions for implementing the specified logical functions. It should be understood that in some alternative implementations, functions indicated in a block may occur out of the order noted in the figures. For example, two blocks shown in succession may be executed or implemented substantially concurrently, or two blocks may sometimes be executed in reverse order, depending upon the functionality involved. Some blocks may also be omitted. It should also be understood that each block of the block diagrams, and combination of the blocks, may be implemented by special purpose hardware-based systems that perform the specified functions or acts, or by combinations of special purpose hardware and computer instructions.

It will be appreciated that the embodiments of the present disclosure are not limited to the exact construction that has been described above and illustrated in the accompanying drawings, and that various modifications and changes may be made without departing from the scope thereof.

What is claimed is:

1. A metrology system comprising:
a memory storing a set of instructions; and
a processor configured to execute the set of instructions to cause the metrology system to:
receive an acquired image of a sample;
determine a set of image parameters based on an analysis of the acquired image;
determine a set of model parameters based on the set of image parameters;
generate a set of simulated images based on the set of model parameters; and
output a set of guidance parameters based on an analysis of the set of simulated images and the set of model parameters.

2. The system of claim 1, further comprising a charged particle beam apparatus configured to acquire an image of the sample.

3. The system of claim 1, wherein the set of simulated images includes only a single simulated image.

4. The system of claim 1, wherein the analysis comprises a comparison of information from the set of simulated images and the set of model parameters.

5. The system of claim 4, wherein the information from the set of simulated images comprises critical dimension measurement results.

6. The system of claim 1, wherein at least one of the set of image parameters, the set of model parameters, or the set of guidance parameters comprises a single parameter.

7. The system of claim 1, wherein the set of image parameters comprises any of noise levels, pattern of interest, line roughness, or edge profile.

8. The system of claim 1, wherein the set of model parameters is determined from the set of image parameters based on a quality metric.

9. The system of claim 8, wherein the set of model parameters being determined from the set of image parameters is based on a plurality of quality metrics.

10. The system of claim 9, wherein the plurality of quality metrics comprises any of local noise level, global noise level, edge profile statistics, or pattern structure.

11. The system of claim 1, wherein the set of guidance parameters comprises any of recommended imaging parameter, critical dimension uniformity parameter, measurement precision, repeatability, or measurement accuracy.

12. The system of claim 1, wherein the processor is configured to execute the set of instructions to further cause the metrology system to:
receive auxiliary information associated with target parameters; and
analyze the acquired image based on the received auxiliary information.

13. The system of claim 12, wherein the target parameters comprise any of targeted pitch, targeted critical dimension uniformity, targeted pattern, or targeted measurement precision.

14. The system of claim 1, wherein the processor is configured to execute the set of instructions to further cause the metrology system to:
perform measurement of a critical dimension of the set of simulated images to obtain critical dimension measurements; and
compare the critical dimension measurements with the set of model parameters.

15. A non-transitory computer readable medium comprising a set of instructions that are executable by one or more processors of an apparatus to cause the apparatus to perform a method comprising:
receiving an acquired image of a sample;
determining a set of image parameters based on an analysis of the acquired image;
determining a set of model parameters based on the set of image parameters;
generating a set of simulated images based on the set of model parameters; and
providing a set of guidance parameters based on an analysis of the set of simulated images and the set of model parameters.

* * * * *